(12) United States Patent
Hogg

(10) Patent No.: US 8,599,512 B2
(45) Date of Patent: Dec. 3, 2013

(54) CURRENT SENSOR COMPRISING DIFFERENTIAL AMPLIFIER BIASED BY LEAKAGE CURRENT

(75) Inventor: Dennis W. Hogg, Laguna Hills, CA (US)

(73) Assignee: Western Digital Technologies, Inc., Irvine, CA (US)

(*) Notice: Subject to any disclaimer, the term of this patent is extended or adjusted under 35 U.S.C. 154(b) by 222 days.

(21) Appl. No.: 13/235,209

(22) Filed: Sep. 16, 2011

(65) Prior Publication Data

US 2013/0070365 A1    Mar. 21, 2013

(51) Int. Cl.
*G11B 21/02* (2006.01)

(52) U.S. Cl.
USPC .......................................................... 360/75

(58) Field of Classification Search
USPC ......... 360/75, 66, 31, 294.3, 25, 69; 327/537; 330/261
See application file for complete search history.

(56) References Cited

U.S. PATENT DOCUMENTS

| | | | |
|---|---|---|---|
| 4,259,643 A | 3/1981 | Monticelli et al. | |
| 4,510,442 A | 4/1985 | Neher | |
| 4,596,148 A | 6/1986 | Lasser et al. | |
| 4,768,170 A | 8/1988 | Hoff | |
| 5,986,839 A * | 11/1999 | Klaassen et al. | 360/66 |
| 6,359,746 B1 | 3/2002 | Kakekado et al. | |
| 6,504,669 B1 * | 1/2003 | Janz et al. | 360/78.05 |
| 6,529,342 B1 | 3/2003 | Feng et al. | |
| 6,775,089 B1 | 8/2004 | Bonin et al. | |
| 6,876,509 B2 | 4/2005 | Bonin et al. | |
| 6,888,693 B2 | 5/2005 | Boutaghou et al. | |
| 6,967,805 B1 | 11/2005 | Hanchi et al. | |
| 6,980,383 B2 | 12/2005 | Brunnett et al. | |
| 6,982,406 B2 * | 1/2006 | Chen | 250/214.1 |
| 6,998,850 B2 | 2/2006 | Baumgartner | |
| 7,068,457 B2 | 6/2006 | Riddering et al. | |
| 7,280,305 B2 | 10/2007 | Kwon et al. | |
| 7,310,197 B2 | 12/2007 | Baumgart et al. | |
| 7,375,912 B2 * | 5/2008 | Brannon et al. | 360/75 |
| 7,440,220 B1 | 10/2008 | Kang et al. | |
| 7,465,995 B2 | 12/2008 | Chu et al. | |
| 7,679,857 B2 | 3/2010 | Zhu et al. | |
| 7,796,356 B1 | 9/2010 | Fowler et al. | |
| 7,800,858 B1 | 9/2010 | Bajikar et al. | |
| 7,808,746 B2 | 10/2010 | Burbank et al. | |
| 7,903,365 B2 * | 3/2011 | Watanabe | 360/75 |
| 7,952,829 B2 | 5/2011 | Ionescu | |
| 2005/0174665 A1 | 8/2005 | Zhang et al. | |
| 2005/0258339 A1 | 11/2005 | Chen | |
| 2010/0020439 A1 | 1/2010 | Watanabe | |

FOREIGN PATENT DOCUMENTS

| | | |
|---|---|---|
| EP | 0246433 B1 | 5/1992 |
| WO | 03019559 A1 | 3/2003 |
| WO | 2005077043 A3 | 8/2005 |

* cited by examiner

Primary Examiner — Ali Neyzari

(57) ABSTRACT

A current sensor is disclosed comprising a differential amplifier including a first node, a second node, and an output. The current sensor further comprises a first resistor having a first end coupled to the first node and a second end for coupling to a transducer, and a second resistor having a first end coupled to the second node and a second end. When the second end of the second resistor is unconnected and the differential amplifier is driven with a supply voltage, the first node is biased by a first leakage current and the second node is biased by a second leakage current such that the output represents a current flowing through the transducer.

21 Claims, 5 Drawing Sheets

CURRENT SENSOR COMPRISING DIFFERENTIAL AMPLIFIER BIASED BY LEAKAGE CURRENT

BACKGROUND

Current sensors are employed in numerous applications, such as light sensors, temperature sensors, gas sensors, magnetic sensors, motion sensors, proximity sensors, etc. A current sensing circuit typically comprises a suitable transducer that responds to an external stimulus, such as a photodiode responding to changing light, a magnetoresistive sensor responding to changing magnetic flux, or a tunneling current proximity probe responding to the proximity of elements, such as the proximity of a head to a disk in a disk drive. Typically the resistance of a current sensing transducer changes in response to the external stimulus so that when a bias voltage is applied to the transducer, the change in resistance caused by a change in the external stimulus results in a corresponding change in current passing through the transducer. Accordingly, a current sensor is typically employed to detect the change in current and thereby detect changes in the external stimulus.

Certain current sensing transducers, such as the aforementioned tunneling current proximity sensor, exhibit an extremely small change in resistance as the stimulus changes, and therefore they transduce an extremely small current (e.g., nanoamperes). There is, therefore, a need for an extremely sensitive current sensor capable of accurately detecting the extremely small currents generated by certain current sensing transducers.

DETAILED DESCRIPTION OF EMBODIMENTS OF THE INVENTION

Figure 1:
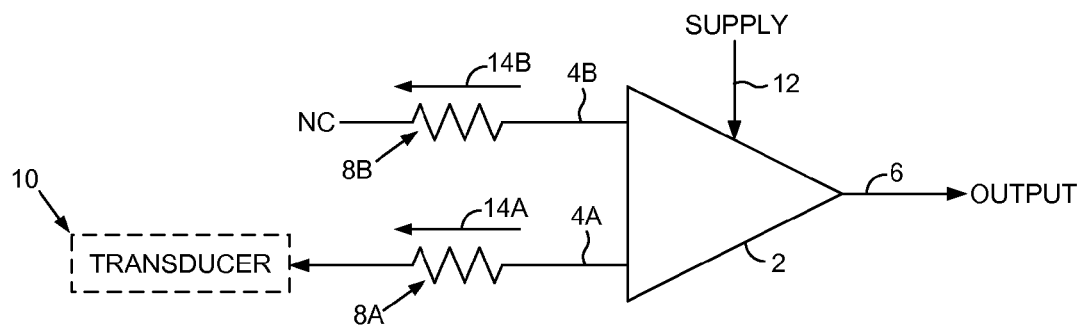
FIG. 1 shows a current sensor according to an embodiment of the present invention comprising a differential amplifier with a first node biased by a first leakage current and a second node biased by a second leakage current.

FIG. 1 shows a current sensor according to an embodiment of the present invention comprising a differential amplifier 2 include a first node 4A, a second node 4B, and an output 6. The current sensor further comprises a first resistor 8A having a first end coupled to the first node 4A and a second end for coupling to a transducer 10, and a second resistor 8B having a first end coupled to the second node 4B and a second end. When the second end of the second resistor 8B is unconnected and the differential amplifier 2 is driven with a supply voltage 12, the first node 4A is biased by a first leakage current 14A and the second node 4B is biased by a second leakage current 14B such that the output 6 represents a current flowing through the transducer 10.

In one embodiment, the differential amplifier 2 is fabricated such that the first leakage current 14A substantially matches the second leakage current 14B (e.g., by matching components). When the transducer 10 draws current it depletes the first leakage current 14A biasing the first node 4A, thereby changing the voltage at the first node 4A so that the output 6 of the differential amplifier 2 represents the current flowing through the transducer 10. In this manner, the current sensor of the present invention is capable of detecting very small currents flowing through the transducer 10 on the order of a fraction of the first leakage current 14A. For example, when the first leakage current 14A is a nanoampere the current sensor may detect a transducer current as small as a fraction of a nanoampere (e.g., 0.01 nanoamperes).

Figure 2:
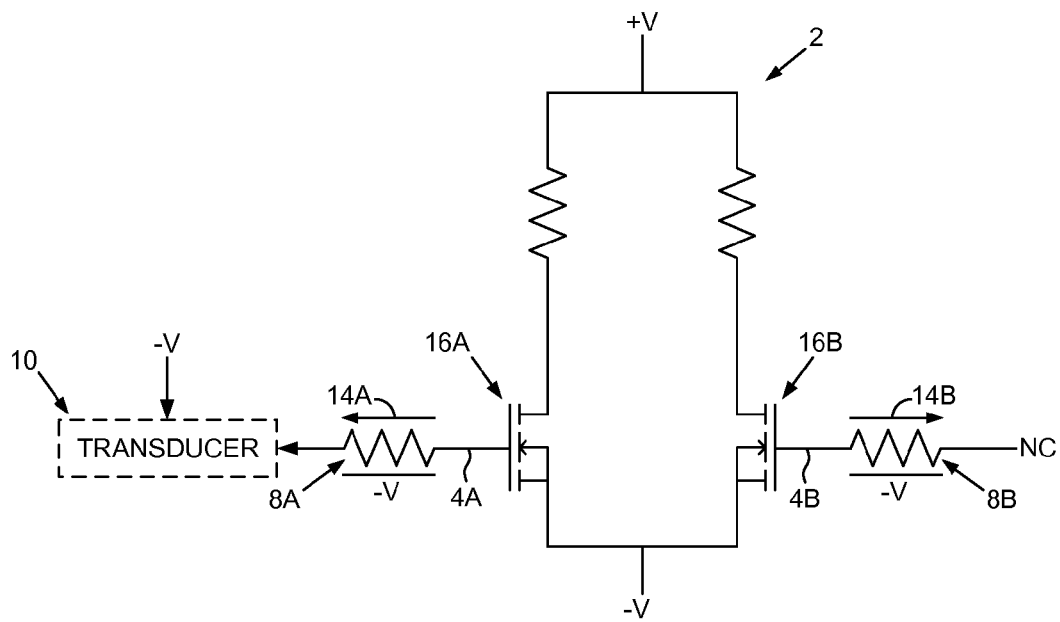
FIG. 2 shows a current sensor according to an embodiment of the present invention wherein the differential amplifier comprises a first and second field effect transistor (FET).

The current sensor may comprise any suitable components for implementing the differential amplifier 2 and the first and second resistors 8A and 8B. FIG. 2 shows a schematic diagram according to an embodiment of the present invention wherein the differential amplifier comprises a first field effect transistor (FET) 16A comprising a first gate connected to the first node 4A, and a second FET 16B comprising a second gate connected to the second node 4B. A bias voltage (−V) is applied to the transducer 10, and the bias voltage (−V) is applied to a source of the first FET 16A and to a source of the second FET 16B. Also in the embodiment of FIG. 2, the bias voltage (−V) is applied to an isolation well of the first resistor 8A and to an isolation well of the second resistor 8B as described below. The leakage current flowing through the resistors 8A and 8B essentially pull both gates of the FETs 16A and 16B down to the bias voltage (−V) when no current is flowing through the transducer 10. When current flows through the transducer 10, it changes the gate voltage of the first FET 16A, thereby changing the output of the differential amplifier 2 (which may be single or double ended). The differential amplifier configuration shown in FIG. 2 may be modified in any suitable manner without deviating from the scope of the present invention, such as by replacing the load resistors with a cascaded pair of transistors that form a current mirror, a cascode configuration, a current source inline with the FET sources, etc. In addition, the differential amplifier may be fabricated with transistors other than FETs, such as with bipolar junction transistors (BJTs).

Figure 3:
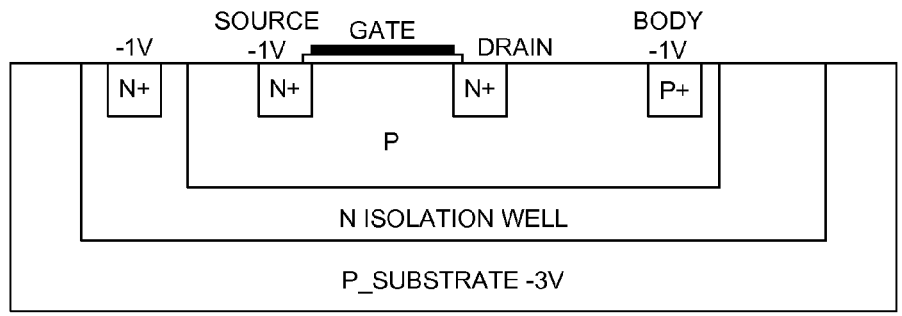
FIG. 3 shows a diffusion diagram for one of the differential amplifier FETs according to an embodiment of the present invention.

FIG. 3 shows a diffusion diagram for one of the FETs of the differential amplifier shown in FIG. 2. This embodiment illustrates an isolation well of the FET connected to a bias voltage of −1V and a substrate biased at −3V. This configuration helps minimize leakage current to other circuit nodes as well as minimize body diode leakage. Although bias voltages of −1V and −3V are shown in FIG. 3, any suitable bias voltages may be employed.

Figure 4:
FIG. 4 shows a semiconductor resistor connected to a gate of one of the differential amplifier FETs and comprising a polysilicon resistor, a P-base resistor, and a N-base resistor according to an embodiment of the present invention.

In one embodiment, the first resistor 8A and the second resistor 8B comprise a semiconductor resistor, and in one embodiment, the semiconductor resistors provide electrostatic discharge (ESD) protection. FIG. 4 shows an embodiment wherein each resistor 8A and 8B comprise three resistors: a P based resistor (P_BASE), a N based resistor (N_BASE), and a polysilicon resistor (POLY) which has the highest resistance and serves to isolate the other resistors from high energy EDS events. The P based resistor protects against a positive ESD and the N based resistor protects against a negative ESD.

Figure 5:
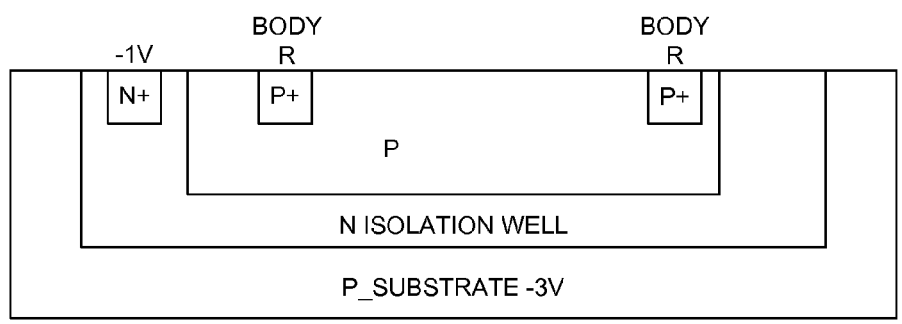
FIG. 5 shows a diffusion diagram for a P-base semiconductor resistor according to an embodiment of the present invention.
Figure 6:
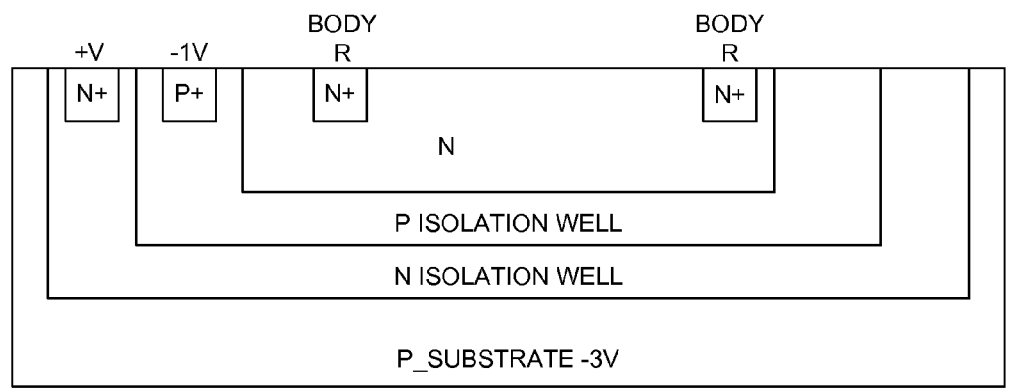
FIG. 6 shows a diffusion diagram for a N-base semiconductor resistor according to an embodiment of the present invention.

FIG. 5 is a diffusion diagram for a P based resistor according to an embodiment of the present invention comprising a N based isolation well connected to the −1V bias voltage, thereby forming a first polarity diode that protects against a positive ESD. FIG. 6 is a diffusion diagram for a N based resistor according to an embodiment of the present invention comprising a P based isolation well connected to the −1V bias voltage, thereby forming a second polarity diode that protects against a negative ESD.

Figure 7A:
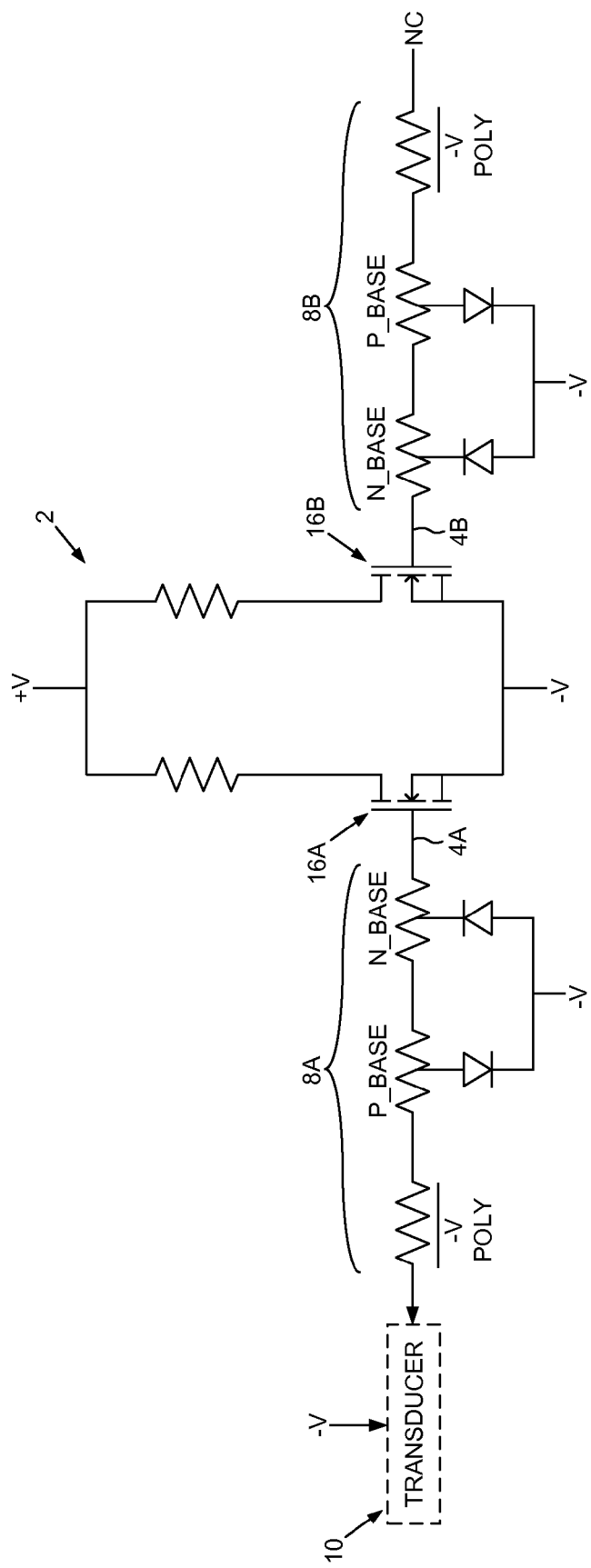
FIG. 7A shows an embodiment of the present invention wherein the semiconductor resistors provide electrostatic discharge (ESD) protection.
Figure 7B:
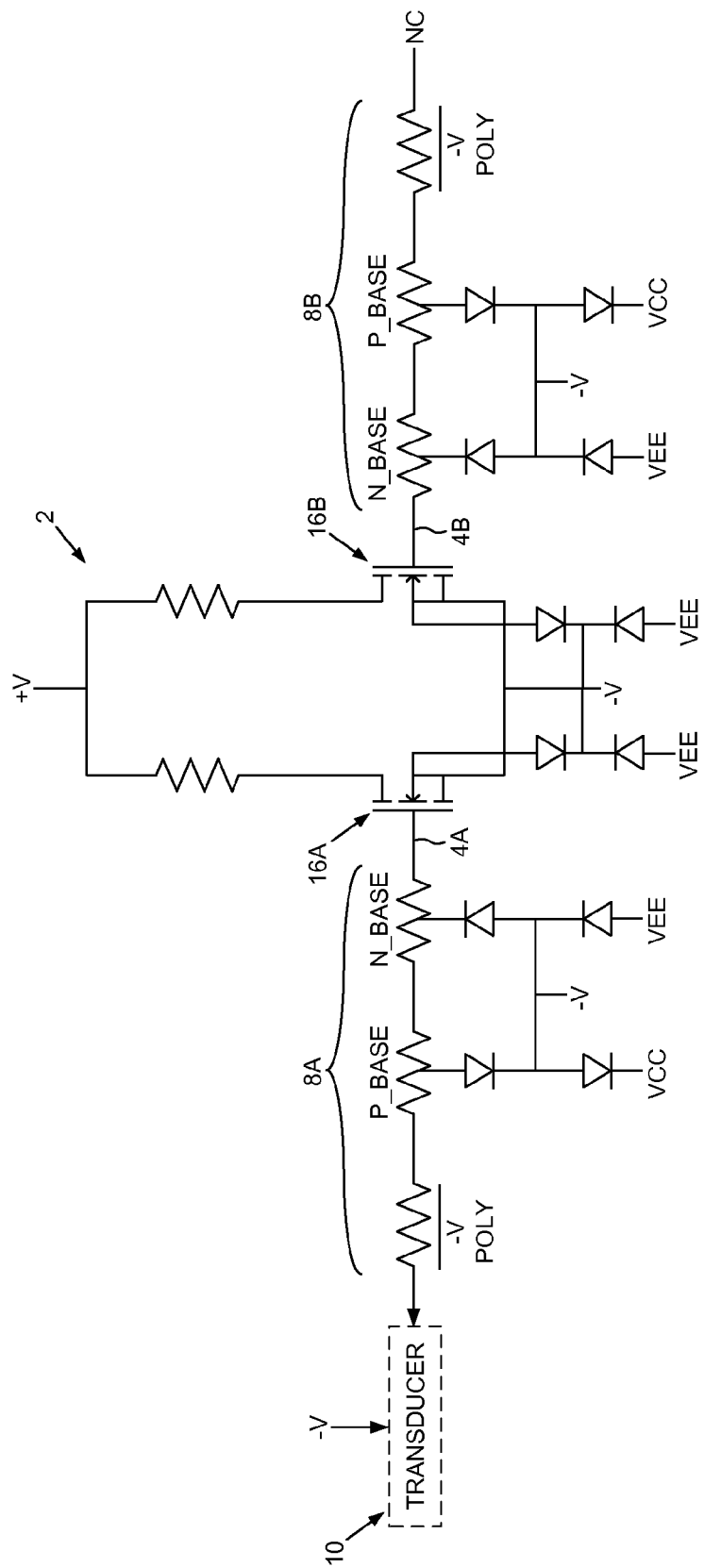
FIG. 7B shows an embodiment of the present invention utilizing additional diodes for ESD protection.

FIG. 7A shows a schematic diagram illustrating the embodiment where the first and second resistors 8A and 8B comprise the semiconductor resistors shown FIG. 4, including the ESD protection diodes of the P based and N based resistors. FIG. 7B shows an alternative embodiment where the −1V bias voltage may be connected to the most positive supply through an opposite polarity diode and to the most negative supply through an opposite polarity diode for complete ESD protection.

Figure 8A:
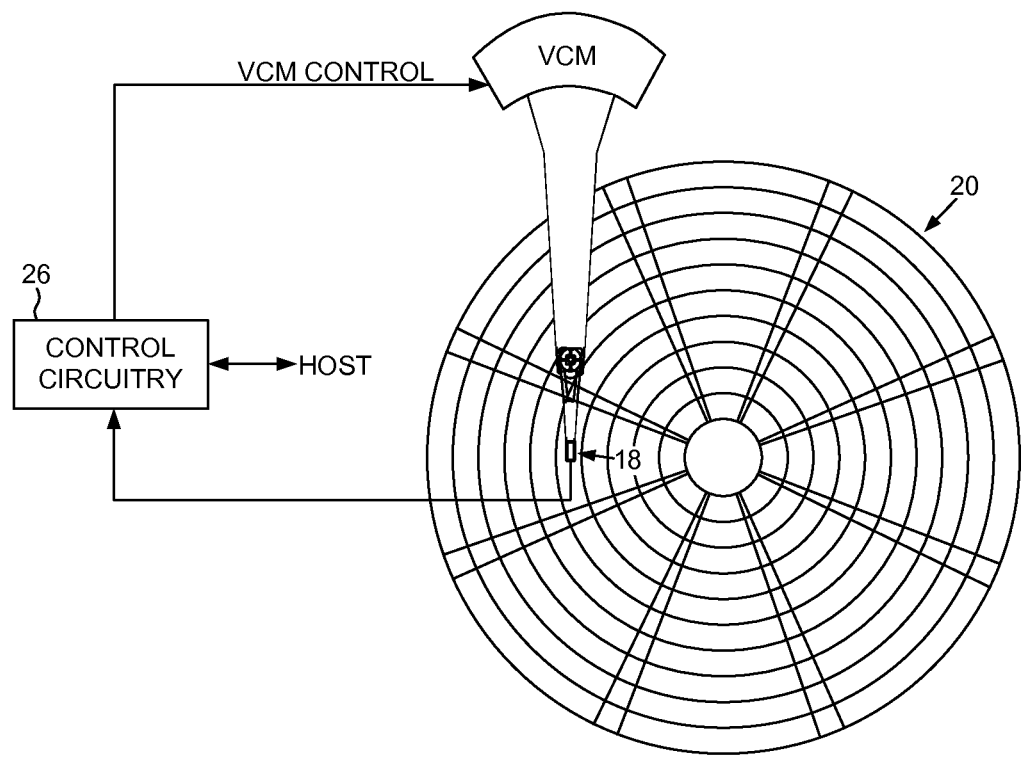
FIG. 8A shows a disk drive according to an embodiment of the present invention comprising a head actuated over a disk, wherein the current sensor senses a current generated by a fly height transducer.
Figure 8B:
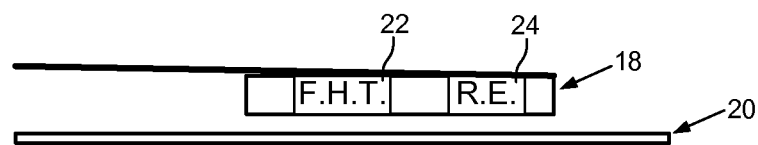
FIG. 8B shows a head comprising a read element and a fly height transducer according to an embodiment of the present invention.

FIG. 8A shows a disk drive according to an embodiment of the present invention comprising a head 18 actuated over a disk 20, and a fly height transducer 22 (FIG. 8B) operable to generate a fly height signal for the head 18. The disk drive further comprises control circuitry 26 comprising the current sensor of FIG. 1 for detecting a current flowing through the fly height transducer 22. Any suitable fly height transducer 22 may be employed, and in one embodiment, the fly height transducer generates the fly height signal based on extremely small changes in current flowing through the fly height transducer 22. For example, in one embodiment the fly height transducer 22 comprises a tunneling sensor which exhibits extremely small current fluctuations relative to the changing fly height of the head 18. In the embodiment shown in FIG. 8B, the head 18 comprises a read element 24 such as a magnetoresistive read element for reading data recorded on the disk separate from the fly height transducer 22. In another embodiment, the read element 24 may perform both the read function as well as the fly height detection (i.e., the read element 24 may also be the fly height transducer).

What is claimed is:

1. A current sensor comprising:
a differential amplifier comprising a first node, a second node, and an output;
a first resistor having a first end coupled to the first node and a second end for coupling to a transducer; and
a second resistor having a first end coupled to the second node and a second end,
wherein when the second end of the second resistor is unconnected and the differential amplifier is driven with a supply voltage, the first node is biased by a first leakage current and the second node is biased by a second leakage current such that the output represents a current flowing through the transducer.

2. The current sensor as recited in claim 1, wherein the first leakage current substantially matches the second leakage current.

3. The current sensor as recited in claim 1, wherein the output represents a fraction of the first leakage current.

4. The current sensor as recited in claim 1, wherein:
the first resistor comprises a semiconductor resistor; and
the second resistor comprises a semiconductor resistor.

5. The current sensor as recited in claim 4, wherein when a bias voltage is applied to the transducer, the bias voltage is applied to an isolation well of the first resistor and the bias voltage is applied to an isolation well of the second resistor.

6. The current sensor as recited in claim 5, wherein:
a body of the first resistor and the isolation well form a first diode operable to provide protection against electrostatic discharge (ESD); and
a body of the second resistor and the isolation well form a second diode operable to provide protection against ESD.

7. The current sensor as recited in claim 6, wherein each of the first and second resistor comprise:
a first ESD resistor comprising a first polarity diode operable to protect against a positive ESD; and
a second ESD resistor comprising a second polarity diode operable to protect against a negative ESD.

8. The current sensor as recited in claim 7, wherein:
the first ESD resistor comprises a P-type semiconductor; and
the second ESD resistor comprises a N-type semiconductor.

9. The current sensor as recited in claim 1, wherein the differential amplifier comprises:
a first field effect transistor (FET) comprising a first gate connected to the first node; and
a second FET comprising a second gate connected to the second node.

10. The current sensor as recited in claim 9, wherein when a bias voltage is applied to the transducer, the bias voltage is applied to a source of the first FET and the bias voltage is applied to a source of the second FET.

11. The current sensor as recited in claim 10, wherein when the bias voltage is applied to the transducer, the bias voltage is applied to an isolation well of the first FET and the bias voltage is applied to an isolation well of the second FET.

12. The current sensor as recited in claim 1, wherein the current sensor is incorporated in a disk drive comprising:
a disk;
a head actuated over the disk; and
a fly height transducer operable to generate a fly height signal for the head; wherein the current sensor is operable to detect a current flowing through the fly height transducer.

13. The current sensor as recited in claim 12, wherein the fly height transducer comprises a tunneling sensor.

14. A method of sensing current using a differential amplifier, the differential amplifier comprising a first node, a second node, and an output, the method comprising:
coupling a first end of a first resistor to the first node and a second end of the first resistor to a transducer;
coupling a first end of a second resistor to the second node and leaving a second end of the second resistor unconnected; and
biasing the first node with a first leakage current and biasing the second node with a second leakage current such that the output represents a current flowing through the transducer.

15. The method as recited in claim 14, wherein the first leakage current substantially matches the second leakage current.

16. The method as recited in claim 14, wherein the output represents a fraction of the first leakage current.

17. The method as recited in claim 14, wherein the first resistor comprises a semiconductor resistor and the second resistor comprises a semiconductor resistor, the method further comprising:
- applying a bias voltage to the transducer;
- applying the bias voltage to an isolation well of the first resistor; and
- applying the bias voltage to an isolation well of the second resistor.

18. The method as recited in claim 14, wherein the differential amplifier comprises:
- a first field effect transistor (FET) comprising a first gate connected to the first node; and
- a second FET comprising a second gate connected to the second node, the method further comprising:
- applying a bias voltage to the transducer;
- applying the bias voltage to a source of the first FET; and
- applying the bias voltage to a source of the second FET.

19. The method as recited in claim 18, further comprising:
- applying the bias voltage to an isolation well of the first FET; and
- applying the bias voltage to an isolation well of the second FET.

20. The method as recited in claim 14, wherein the differential amplifier is operable to sense a current flowing through a fly height transducer of a disk drive.

21. The method as recited in claim 20, wherein the fly height transducer comprises a tunneling sensor.

* * * * *